US007592884B2

(12) United States Patent
Matters-Kammerer et al.

(10) Patent No.: US 7,592,884 B2
(45) Date of Patent: Sep. 22, 2009

(54) HIGH FREQUENCY COMPONENT

(75) Inventors: Marion Kornelia Matters-Kammerer, Valkenswaard (NL); Rainer Kiewitt, Roetgen (DE); Klaus Reimann, Aachen (DE)

(73) Assignee: NXP B.V., Eindhoven (NL)

( * ) Notice: Subject to any disclaimer, the term of this patent is extended or adjusted under 35 U.S.C. 154(b) by 342 days.

(21) Appl. No.: 10/565,934

(22) PCT Filed: Jul. 15, 2004

(86) PCT No.: PCT/IB2004/051228

§ 371 (c)(1),
(2), (4) Date: Jan. 20, 2006

(87) PCT Pub. No.: WO2005/011046

PCT Pub. Date: Feb. 3, 2005

(65) Prior Publication Data

US 2008/0048797 A1 Feb. 28, 2008

(30) Foreign Application Priority Data

Jul. 28, 2003 (EP) .................................. 03102323

(51) Int. Cl.
*H03H 7/01* (2006.01)

(52) U.S. Cl. ........................................ 333/185; 333/25

(58) Field of Classification Search ................. 333/175, 333/185, 25
See application file for complete search history.

(56) References Cited

U.S. PATENT DOCUMENTS

| | | | | |
|---|---|---|---|---|
| 5,640,699 | A * | 6/1997 | Ralph | 455/326 |
| 5,697,088 | A | 12/1997 | Gu | |
| 6,879,223 | B2 * | 4/2005 | Park et al. | 333/185 |
| 2003/0134612 | A1 * | 7/2003 | Nakayama et al. | 455/307 |

FOREIGN PATENT DOCUMENTS

| | | | |
|---|---|---|---|
| WO | WO 02/093741 | A1 | 11/2002 |

* cited by examiner

*Primary Examiner*—Benny Lee

(57) ABSTRACT

The invention relates to a high frequency component with a substrate constructed of a plurality of dielectric layers and, between them, electrode layers having conducting track structures, in which substrate at least one capacitive element and at least one inductive element is formed, whereby at least one arrangement of opposed conducting track 5 structures is provided, these realizing simultaneously a capacitive and an inductive element, whereby the common-mode impedance and the push-pull impedance between the opposing conducting track structures are adjusted to differ by a factor of at least 2.

30 Claims, 12 Drawing Sheets

HIGH FREQUENCY COMPONENT

The invention relates to a high frequency component with a substrate constructed of a plurality of dielectric layers and, between them, electrode layers having conducting tracks, the substrate having at least one capacitive element and at least one inductive element is formed. High frequency components of this type are used in wireless circuits.

The increasing miniaturization of wireless circuits, as used, for instance, in mobile communications devices requires constant scaling-down for all the functions included. Modern high frequency modules use multilayered substrates in order to increase the integration density. Not only are electrical connections between the components made on the substrate, but essential electrical functions such as, for instance, filters are created by suitable arrangement of conducting tracks in the substrate. Often, structures that would cost a large amount of chip area and upon which moderate accuracy requirements are placed can be more economically displaced onto the circuit board. In part, distributed elements and in part lumped elements are used. Interconnections with stepped impedance lie between the two stated extremes. The latter two designs are always attractive when the size of the circuit is to lie below a quarter wavelength.

It is known to shorten resonator conductors in a comb filter by means of capacitors. The capacitors may be designed as parallel plates in the substrate or as external components. The filter characteristics are substantially determined by the magnetic coupling between the resonators. However, the coupling strength is restricted if, for manufacturing reasons, the resonator conductors have to maintain a minimum distance, if the width of the conducting tracks is chosen to be large in order to keep the conduction losses small, or if the conducting tracks are severely shortened in order to minimize the circuit size. The known planar arrangements are not able to utilize the new possibilities for three-dimensional design in multilayer substrates.

Economic manufacturing processes are usually associated with high tolerances, such as uncertainty in the metallising dimensions or misalignment between two metal layers. This restricts the integration or miniaturization of circuits requiring high precision. G. Passiopolous et al., "The RF Impact of Coupled Component Tolerances and Gridded Ground Plates in LTCC Technology and their Design Counter Measures", Advancing Microelectronics, March/April 2003, pages 6 to 10, describe some countermeasures for capacitors and coils. These measures are ineffective, however, against variations in the conducting track width if high capacity densities have to be achieved which can no longer be attained with the interdigital capacitors given.

Bandpass filters are needed for almost every microwave application. In particular, narrow band transmitting and receiving circuits, such as are used in mobile radio systems, require bandpass filters in order to suppress all interference signals found outside the frequency band used. Many such passive bandpass filters are based on a similar principle as the aforementioned comb filter and, like these, comprise coupled resonators. If, therefore, improvements can be achieved in the resonators or in their coupling, then these allow themselves to be transferred to many filter types.

A typical circuit arrangement for transmitters or receivers comprises an adaptor network, a balancing transformer and a filter, which finally passes the signal on to the antenna. One disadvantage of this chain circuit is that many individual components are required. Since, in addition, each function is individually optimized, the interconnection may have undesirable resonances due to feedback, particularly in the stop band region. Some suggestions have been made for integrating these functions in a more compact circuit. WO 02/093741 A1 describes how, with few components, a network may be built up which simultaneously contains filters, balancing transformer and adaptor network. The resonators are coupled by means of inductive elements which, however, on integration into a substrate, would occupy much space. In U.S. Pat. No. 5,697,088, a balancing transformer with filter properties is realized with two quarter-wave couplers having at total of four resonant quarter-wave conductors. An adaptor network is not included. However, fewer resonators can be used and the proposed single-layer structure is unable to utilize the miniaturizing possibilities of multilayer substrates.

It is an object of the present invention to define a route by which the passive electrical functions may be integrated at minimal size into multilayer substrates, whereby demanding electrical specifications may also be realized and the sensitivity to manufacturing tolerances are to be reduced as far as possible.

This object is achieved with a high frequency component according to the claims appended hereto. Advantageous embodiments are the subject matter of the subclaims.

According to the invention, at least one arrangement of opposed conductor structures is provided, these realizing simultaneously a capacitive and an inductive element of a resonator circuit in that the common-mode impedance and the push-pull impedance of the opposing conducting track structures are adjusted to differ by a factor of at least 2. Preferably, the conductor structures are linked to each other at particular points or with fixed potentials. Multilayer structures are provided in obvious manner by repetition of the conducting track structures. By means of the distribution of currents to the opposed metal surfaces, lower ohmic losses may be achieved than with single-layer structures. The conductor structures may entirely overlap each other, although they do not have to. From the manufacturing standpoint, a layer offset generally results, whose effect on the resonance frequency, which is described further below, may be reduced. Also at least one of the conductor structures may be extended beyond the other, for instance, to form feed lines, connectors or couplings or to be able to adapt over a larger impedance range. In the latter case, the extensions or connections are used as additional inductive elements and thus allow greater input impedances at the gates without reducing the conducting track width. In particular, with distributed capacitances, as is often the case in thin film technologies, the result is a greater level of design freedom.

The dimensions of the conducting track or the conductor structure transverse to the direction of the current will be denoted in the following as the "width of the conducting track".

With the invention, a resonator may be realized if in at least one arrangement of opposing conductor structures, the start of a conductor structure is placed at the same potential as the end of the opposing conducting track structure. The start and end are found if a direction is specified on the first conductor structure, e.g. the current path, and this is then adopted on the opposing conducting track. The potential may be fixed, in particular, equal to earth. The arrangement then resembles a short-circuited capacitor. Or the arrangement is floating, whereby the arrangement resembles an open coil. If, in the coil-like arrangement, a still free end is connected to earth or a fixed potential, the resonant frequency may be further reduced. By this means, resonators may be realized which are substantially smaller than a quarter-wavelength ($\lambda/4$) and in which inductance and capacitance are provided by the same conductor structures. The different common-mode and push-pull impedance ensure, together with the edge conditions, for different amplitudes and a mixture of common-mode and push-pull operation for the reflections at the end of the lines. After two reflections, the phase jump at the lowest resonant frequency is greater than π. The conductor length is therefore shorter than λ/4, in order to bring the overall phase shift for a cycle to the resonance condition 2π. In order to avoid radiation, an earthed surface should be provided on at least one side of the opposing conducting track structures. Two earthed surfaces provide even better screening. The losses are lowest for a symmetrical sequence of dielectrics if the resonator is arranged centrally between the earthed surfaces. The storage of the magnetic energy is further improved if the resonator is surrounded with magnetic materials, such as ferrites.

According to a preferred embodiment of the invention, the thickness of the dielectric layer arranged between the opposing track structures is smaller than the width of the conducting tracks, and further preferably smaller than half the width of the conducting tracks.

It may also be provided that the dielectric layer between the opposing conducting track structures has an increased dielectric constant compared with surrounding dielectric layers. By means of a very thin layer with raised dielectric constants, strongly differing common-mode and push-pull impedances may be generated. Preferably, the dielectric constant is greater than 5 and, better still, greater than 10 and further preferred, greater than 17. Dielectrics are also known whose dielectric constant is greater even than 70. These are, for instance, ceramics containing barium-rare earth-titanium-perovskites, barium-strontium-titanates, bismuth pyrochlore structures, tantalum oxides, magnesium-aluminium-calcium-silicates, (calcium, strontium)-zirconates or magnesium-titanates, also in combination with boron or lead silicate glasses. Insofar as these are compatible with the manufacturing processes, these types of material may also be successfully utilized in the invention. The choice of layer thickness will then depend upon the planned application and the size of the dielectric constants. The precise dimensions of a resonator as described above may be determined with, for instance, a usual simulator (e.g. Sonnet, Sonnet Software, Inc., or IE3D, Zeland Software) for electromagnetic fields. To this end, the frequency response is calculated for an output structure and the conducting track length is adjusted until the resonance occurs at the desired frequency.

For many planar structures, to a good approximation, the inductance L and the capacitance C are proportional to the areas $A_L$ and $A_C$. The resonant frequency is a product of L and C. Minimizing of the total area $$A_{tot}=A_C+A_L$$

with the subsidiary condition $$A_C \cdot A_L=\text{constant}$$

then leads to $$A_{tot}=\text{minimum when } A_C=A_L$$

The necessary separations from adjoining conducting tracks may well be included in the area calculation. This condition is automatically fulfilled with the structure according to the invention.

Dependent upon the manufacturing process, the electrode layers are not perfectly aligned over one another, leading to variations in the distributed capacitance and inductance of the conducting tracks. This effect may be counteracted by broadening one of the conducting tracks on both sides by the distance k (FIG. 9*b*). A compensation k equal to the maximum positional offset v plus half the thickness d of the dielectric layer situated between the electrode layers has proved to be a suitable compensation for manufacturing variations (FIG. 10). The resonators are then less sensitive to variations in the width of the conducting track. For if the width of the conducting track increases, the capacitance also increases, but the decreasing inductance partly compensates for this effect. The higher the ratio of the width of the conducting track to the separation from the earth surfaces, the less the resonant frequency changes.

Dependent upon production, the magnetic coupling between two resonators may be very uncertain if the separation is chosen to be small. Or else the separation cannot be made small enough to achieve the desired coupling strength. According to a further embodiment of the invention, it is therefore provided that the inductive coupling between two conducting tracks is improved by a bridge linking them (FIG. 12*a*). As an alternative, two conducting tracks may be coupled by a common conducting member, which may also be a connection between two electrode layers (FIG. 12*b*).

The substrate is preferably a ceramic laminate of low temperature co-fired ceramics (LTCC) or of high temperature co-fired ceramics (HTCC), an organic laminate, a semiconductor substrate or a substrate based on thin film technology.

Using the resonators described above, filters may be constructed whereby the input and output of signals and the coupling of the resonators between them takes place directly via a conducting track connected to a conducting track structure, inductively via a conducting track parallel to the conducting track structure and/or capacitively via a capacitor. The coupling capacitor may also be integrated into the substrate via adjoining conducting tracks.

Simultaneous capacitive coupling (indicated by E in FIGS. 1 and 2) and inductive coupling (indicated by B in FIGS. 1 and 2) creates zero points in the transmission function. That means that at particular frequencies, no signal is transferred. This phenomenon is known for comb filters, for instance, if the lines are exactly λ/4 long.

Terminating capacitors or coupling capacitors may be used, as in the case of typical resonator conductors for further reduction of the resonant frequency in order thus to achieve a yet more favorable area utilization. The advantages of the multilayer structures remain in effect here.

With the invention, a balun or balancing transformer with at least one resonator may be constructed, whereby the input of signals takes place symmetrically and the output asymmetrically. The symmetrical connections may possibly have to be displaced from their perfectly symmetrical position, in order to achieve equal voltage levels. The design of an adaptor network is also possible in that the impedance of the couplings is determined by their positioning on the respective conducting track structure.

The space saving is particularly significant if the filter is simultaneously used as a balancing transformer and/or an adaptor network. The balancing transformer is formed by a symmetrical infeed into a resonator. The adaptor network is then achieved through a suitable coupling strength of the inputs and outputs to a resonator. As a rule, infeed and coupling take up hardly any additional space (FIGS. 6 and 7).

The invention enables greater design freedom for the resonators and couplings and allows the function of the high frequency component to be tailor made to the application or specifications. At the same time, the circuit is very compact, it may be designed insensitive to manufacturing tolerances and has low loss levels.

These and other aspects of the invention are apparent from and will be elucidated, by way of non-limitative example, with reference to the embodiment(s) described hereinafter.

Figure 1:
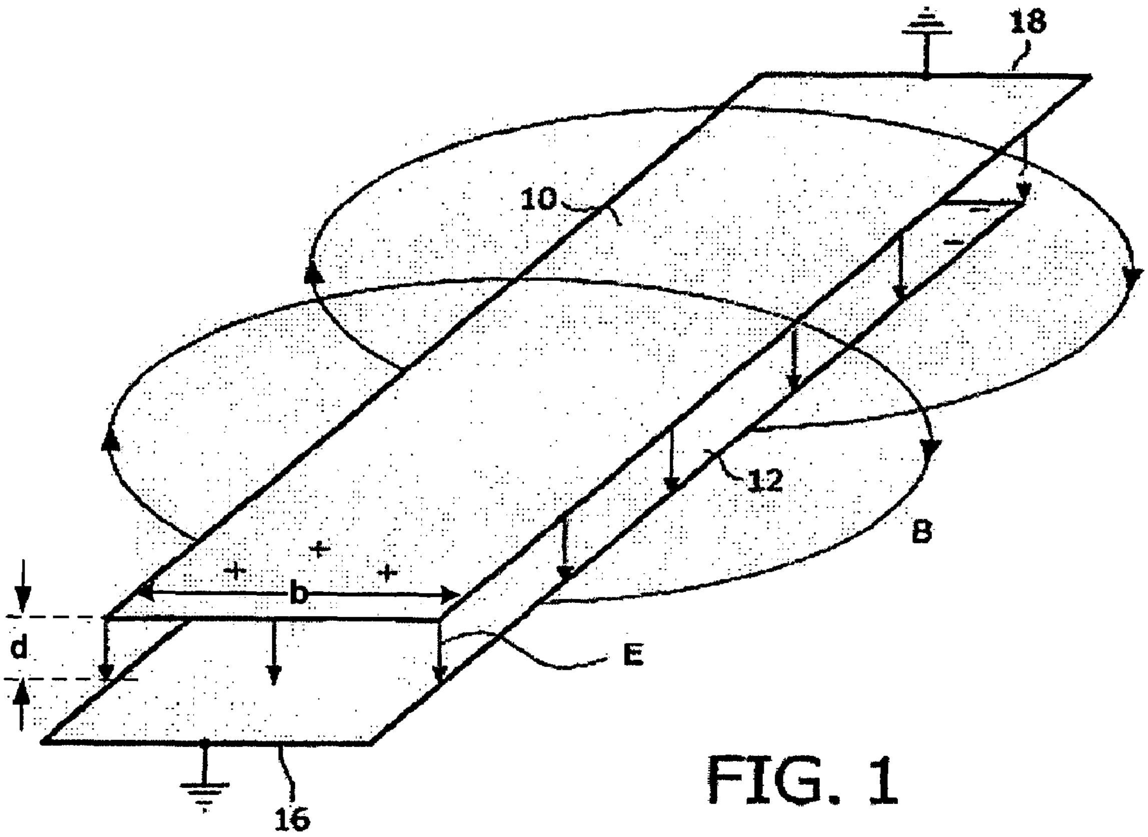
FIG. 1 shows a first embodiment of a resonant conducting track arrangement, which is similar to a short-circuited capacitor.
Figure 3A:
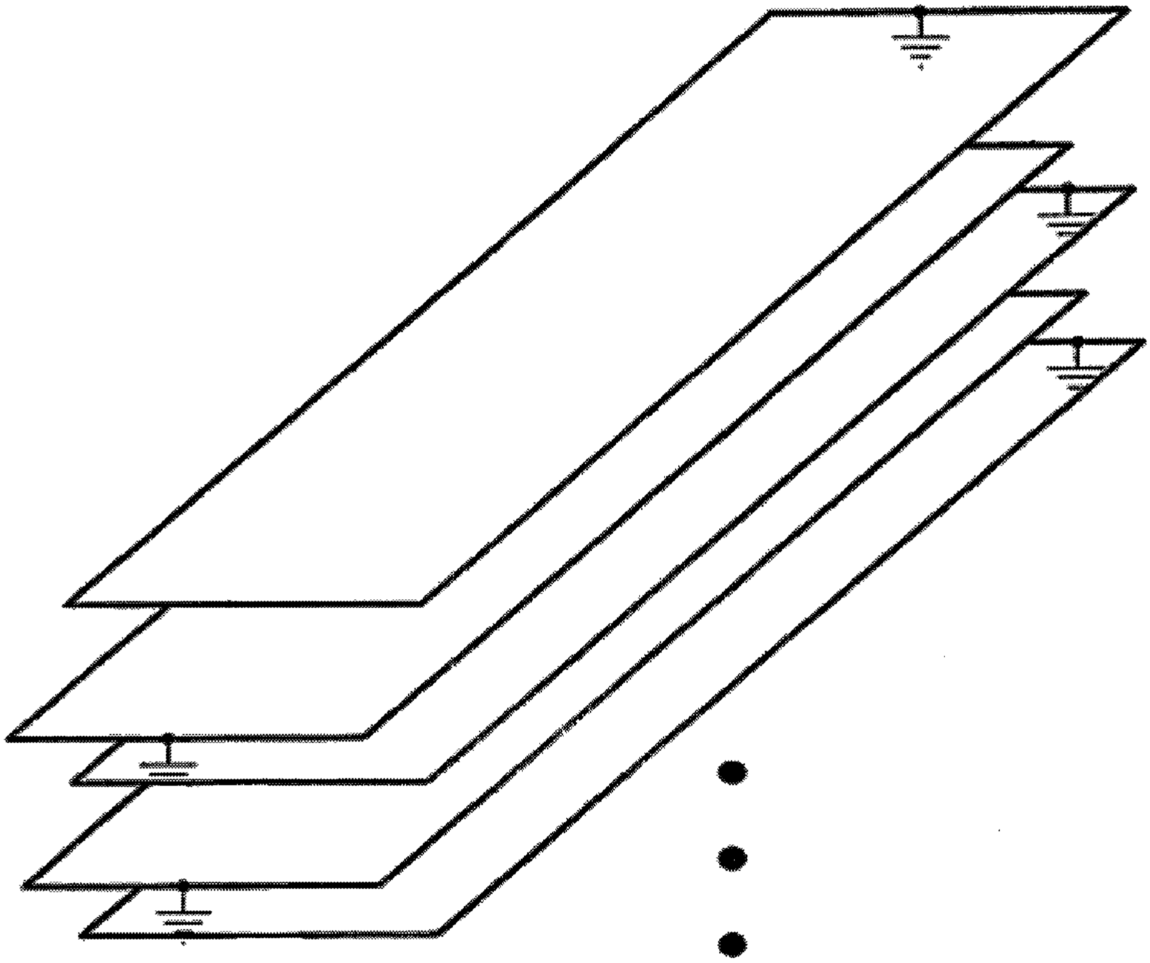
Figure 3B:
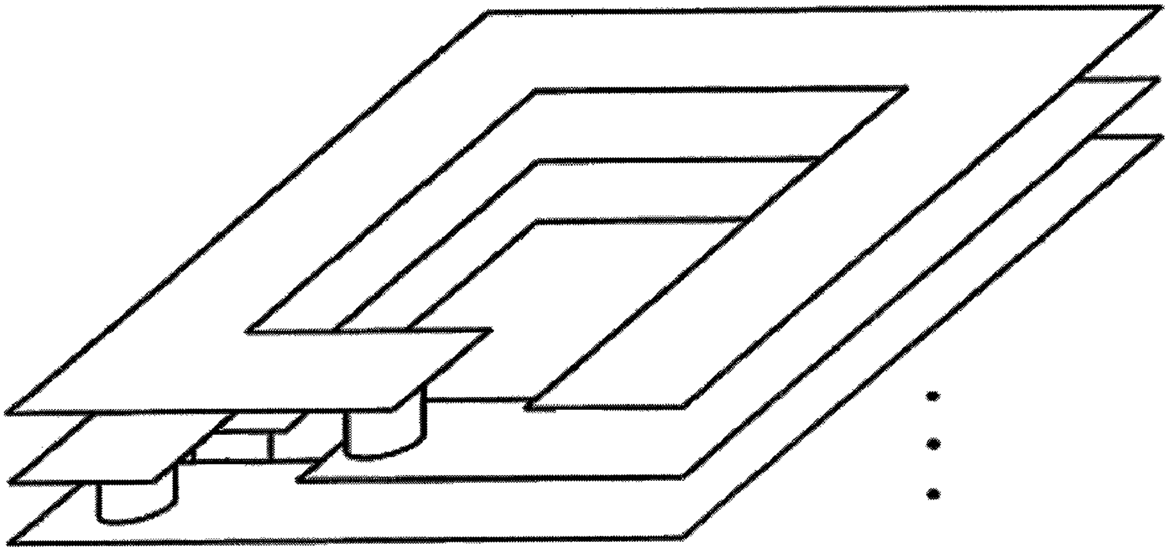
Figure 4:
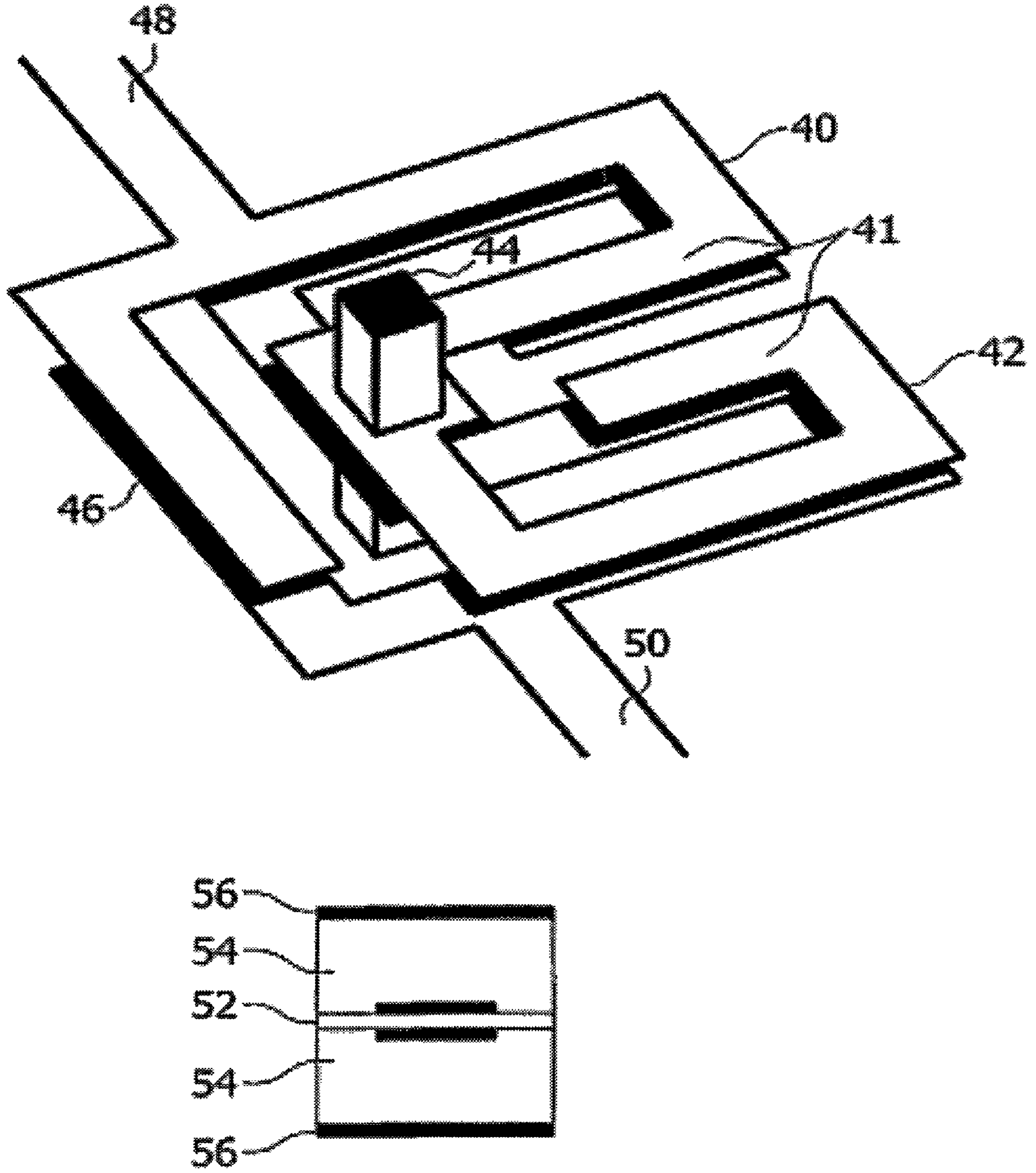
Figure 5:
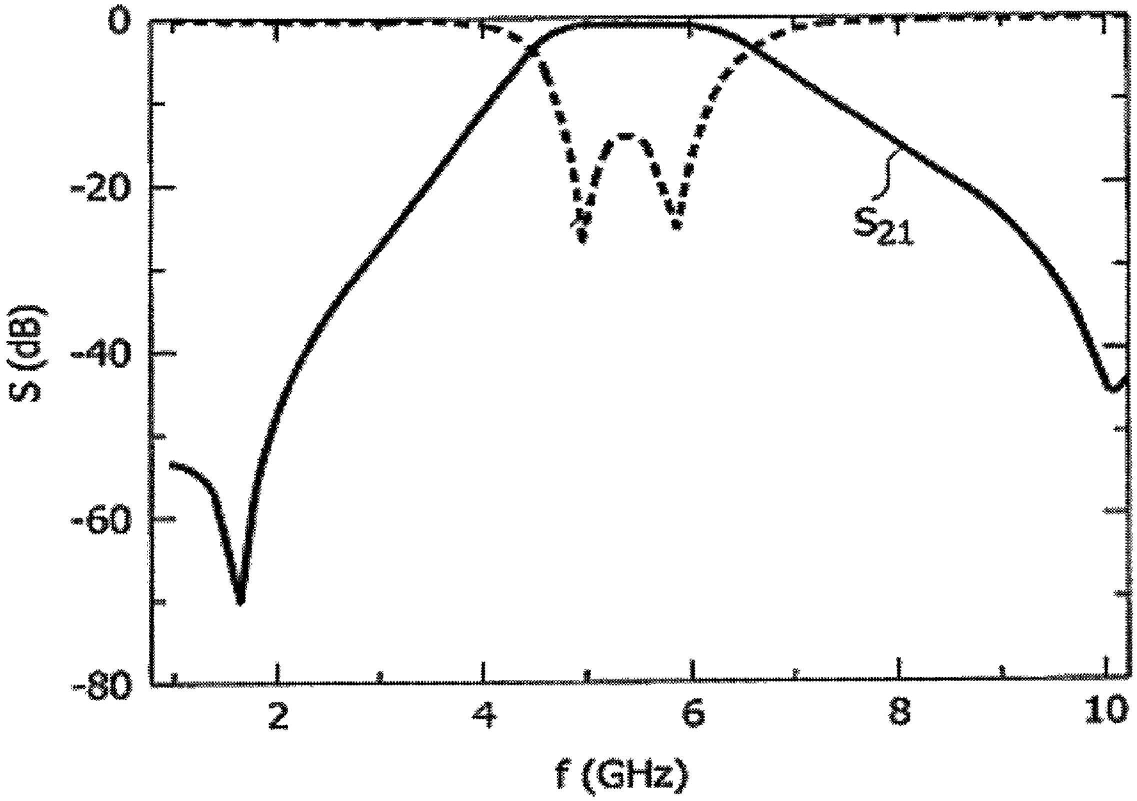
Figure 6:
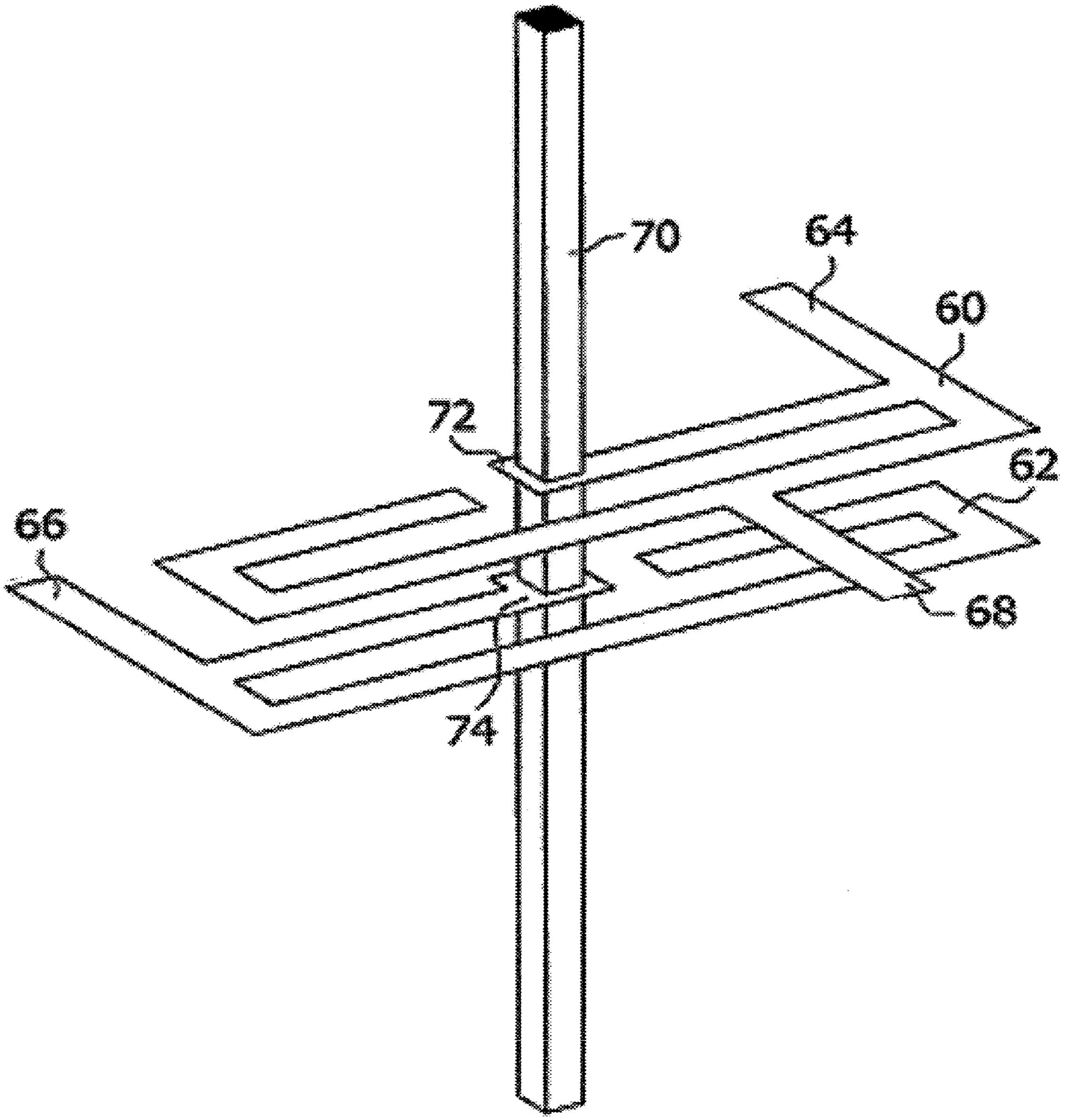
Figure 7:
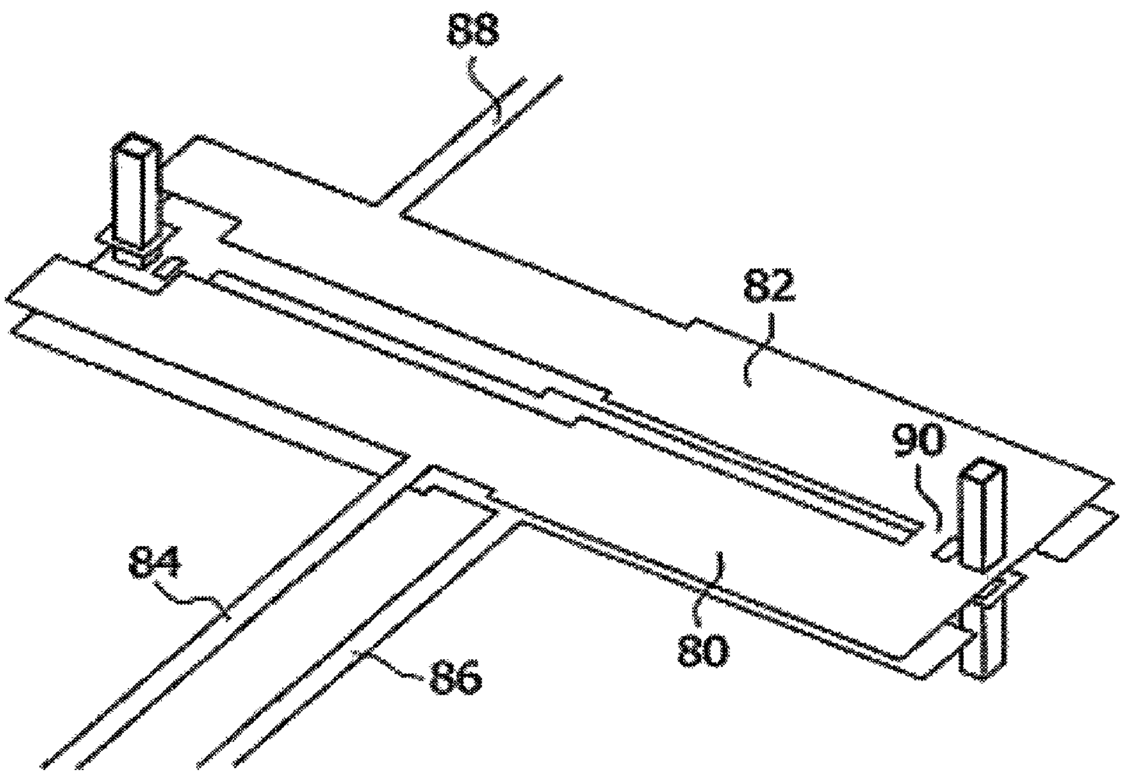
Figure 8:
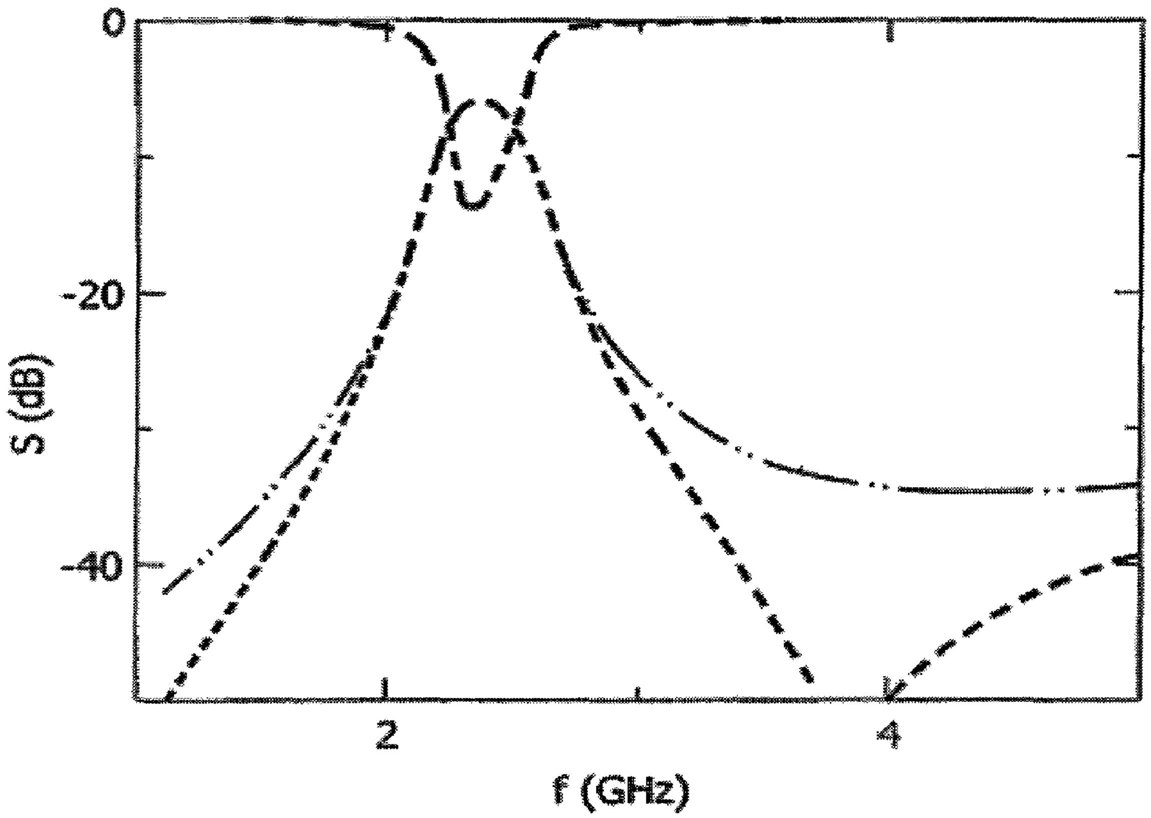
Figure 9A:
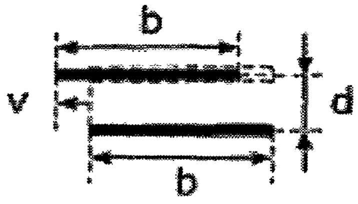
Figure 9B:
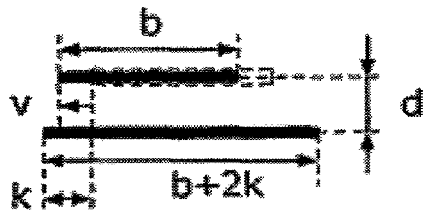
Figure 10:
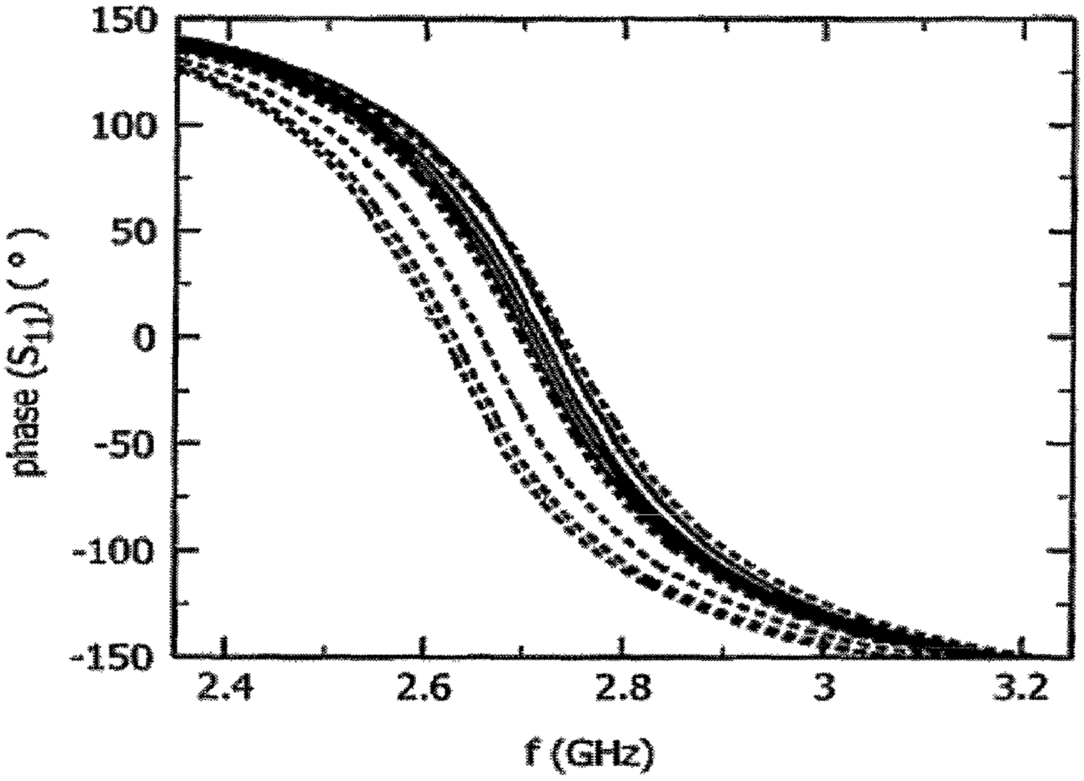

FIGS. 3*a* and 3*b* show examples of multilayered arrangements of the first and second embodiment;

FIG. 4 shows an example of a bandpass filter with two resonators according to the embodiment in FIG. 1 together with an example of a layered structure in a multilayered substrate;

FIG. 5 shows the calculated frequency response of the filter in FIG. 4;

FIG. 6 shows a balancing transformer or balun with a resonator according to FIG. 1;

FIG. 7 shows an embodiment of a combined filter, balancing and adaptor network with two resonators according to FIG. 1;

FIG. 8 shows the calculated frequency response of the network according to FIG. 7;

FIGS. 9*a* and 9*b* show schematically the layer offset v for conducting tracks of width b and its compensation k;

FIG. 10 shows a representation of the phase-frequency characteristic for an uncompensated structure (k=0 μm) according to FIG. 9*a* and for a compensated structure (k=0 μm) according to FIG. 9*b;*

Figure 2:
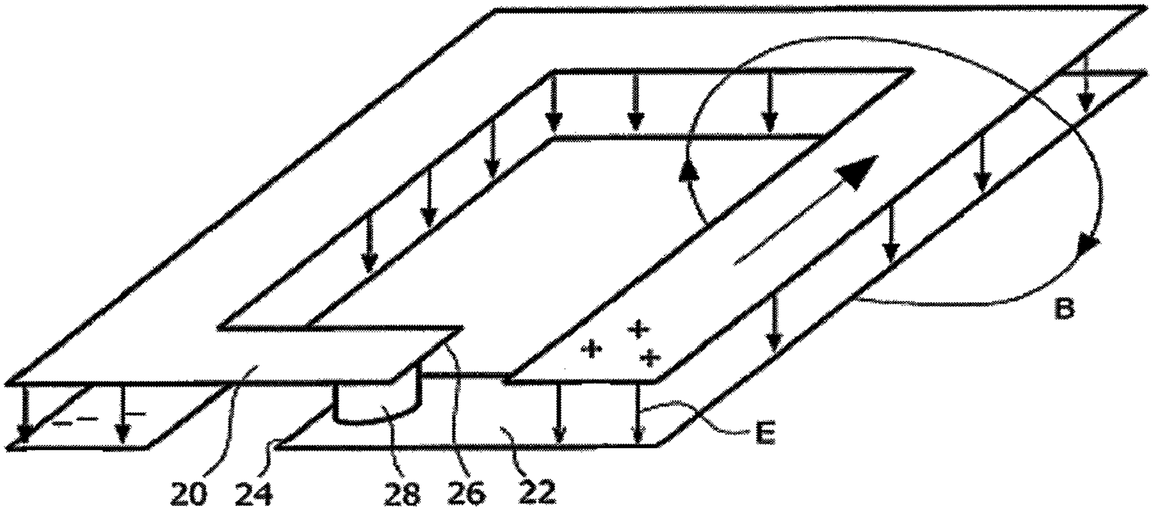
FIG. 2 shows a further embodiment of a resonant conducting track arrangement which has similarities to an open coil.
Figure 11:
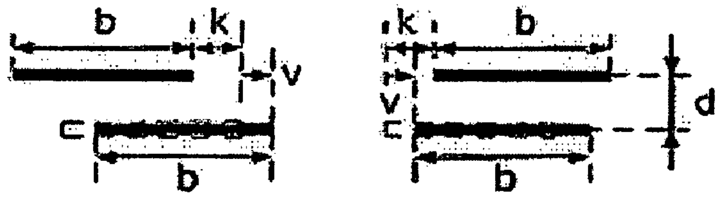
Figure 12A:
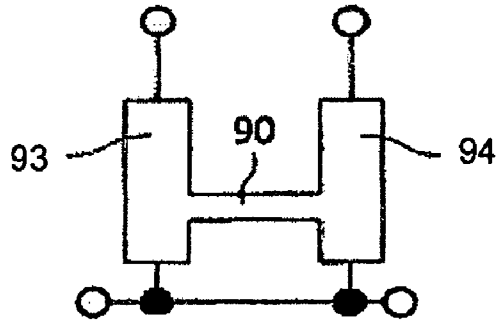
Figure 12B:
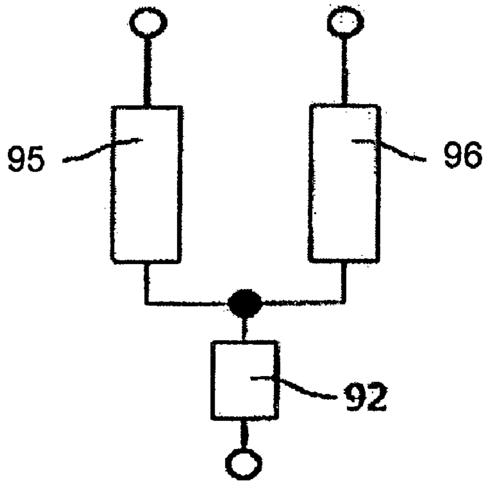
Figure 13:
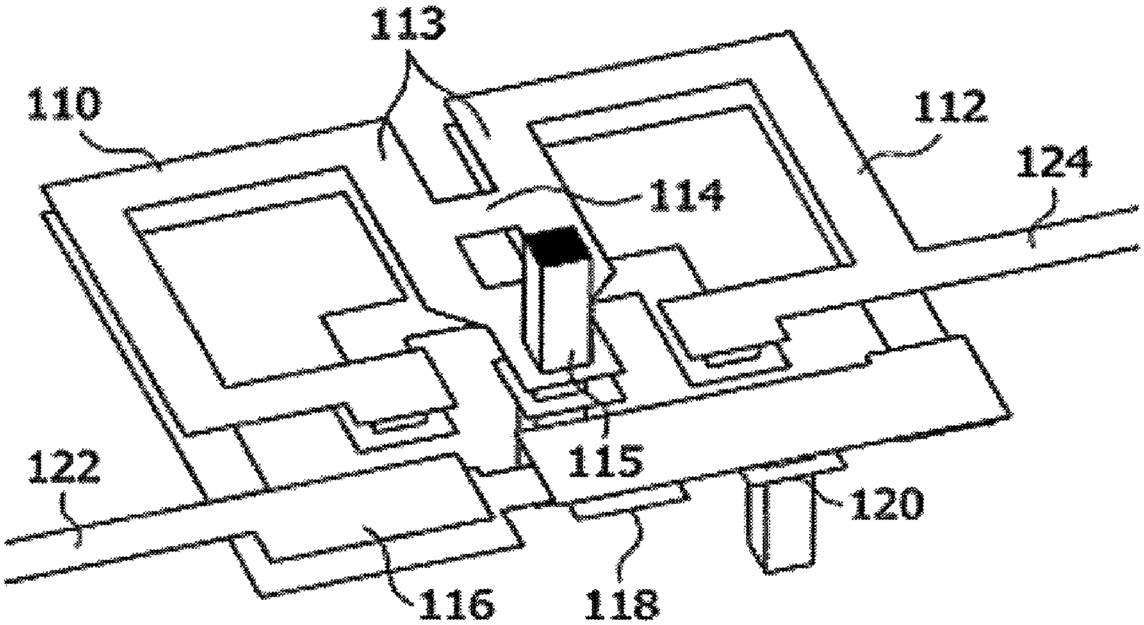

FIG. 11 shows a schematic representation in cross-section to illustrate the compensation k for layer offset v for coil-like structures;

FIGS. 12*a* and 12*b* show examples of inductive coupling in an embodiment of the invention;

FIG. 13 shows an embodiment of an integrated bandpass filter with two resonators according to the embodiment in FIG. 2 and a coupling according to FIG. 12*a*.

The resonator shown in FIG. 1 comprises two conducting track sections 10, 12, which oppose each other. In their overlap region, in the actual design there is arranged a thin dielectric layer, although this is not shown in FIG. 1. The larger the dielectric constant is, the smaller the resonator may be built. The dielectric constant $\epsilon$ is therefore preferably larger than 5. Actual embodiments also include materials with dielectric constants $\epsilon>17$ or even materials with a dielectric constant $\epsilon>70$. The thickness d of the dielectric layer is smaller than half the width b (e.g., one fifth the width b) of a conducting track member 10 or 12. The beginning 16 of the conducting track member 12 is connected to ground, as is the end 18 of the conducting track member 10.

A resonator according to a further embodiment of the invention is shown in FIG. 2. Here, the conducting track structures 20, 22 are designed spiral-shaped, the beginning 24 and the end 26 are linked to each other via a coupling member 28, so that they are at the same, floating potential. Coupling member 28 is indicated as forming a lead-through through the insulating layer disposed between the conducting track structures, and can also be formed as a non-overlapping extension of the conducting track structures.

Both with the embodiment according to FIG. 1 and also the embodiment according to FIG. 2, resonators may be realized in a multilayer substrate that are substantially smaller than a quarter wavelength and in which inductance and capacitance are not spatially separated.

FIGS. 3*a* and 3*b* show examples of multilayer structures for resonators according to FIG. 1 or FIG. 2. Again, the dielectric layers are left out between the individual layers. Either similar or different resonator types may be combined in a layered structure.

FIG. 4 shows a bandpass filter made up from two resonators 40, 42 according to FIG. 1. The resonators 40, 42 are attached to earth 44 with their electrically remote ends. A coupling capacitor 46 provides for a further reduction of the resonant frequency of the filter and, together with the inductive coupling through the conducting track members 41 running parallel, an additional zero point in the transmission function. The input or output of signals takes place via connecting members 48, 50 directly connected to the conducting track structures. FIG. 4 also shows an example of a layered structure. The dielectric layer 52 of the filter is 25 μm thick and comprises a material with a dielectric constant $\epsilon$ of 18. The dielectric layers 54 surrounding the filter each have a thickness of 100 μm and comprise a material with a dielectric constant of 7.5. Earthing surfaces 56 complete the symmetrical structure.

FIG. 5 shows the transmission characteristic $S_{21}$ of the filter in FIG. 4. The stop band lies below 2 GHz and good transmission behavior is achieved in the 5 GHz region. In practice, the dimensions of the filter are approximately 1×1 $mm^2$.

FIG. 6 shows a balancing transformer made from a resonator according to FIG. 1. The input of the differential signals takes place symmetrically by means of the connectors 64 of the conducting track structure 60 or 66 of the conducting track structure 62. The output takes place asymmetrically via the connector 68 on the conducting track structure 60. The ends 72 and 74 of the conducting track structures 60 or 62 are connected to earth 70. The layer sequence of the substrate is as in FIG. 4. For the sake of clarity, the drawing has been elongated in the vertical direction.

It is particularly space-saving if the filter is used simultaneously as a balancing transformer and adaptor network. FIG. 7 shows an example of a combined filter, balancing and adaptor network with two resonators 80 and 82 designed according to the principle shown in FIG. 2. Coupling with the first resonator 80 takes place symmetrically via the connectors 84, 86. The output takes place asymmetrically via the connecting member 88. The impedance of the symmetrical connecting members 84, 86 and of the asymmetrical connecting member 88 may be amended by suitable selection of the position of the taps on each resonator 80 or 82. If greater stop band attenuation or steeper flanks are desired than in the spectrum shown in FIG. 8, further resonators may be connected in. The coupling of the resonators 80, 82 is incidentally amplified via a contact bridge 90, as described in greater detail in connection with FIG. 12*a*.

Since, dependent upon manufacturing, the metal layers of the conducting track structures are not perfectly aligned one over the other, variations in the distributed capacitance and inductance of the conducting tracks is to be expected. FIG. 9*a* shows an uncompensated structure in which two conducting tracks of width b are arranged with an offset v above and below a dielectric layer of thickness d. The effects of this unwanted offset v on the resonant frequency may be compensated for with additional conducting track of width 2k (total width b +2k), as shown in FIG. 9*b*, where k is chosen to be at least 70%, and in one example approximately equal to, the maximum position offset v plus half the layer thickness d of the dielectric layer. The effects of the position offset on an arrangement with two b=450 μm-wide conducting tracks for a layer sequence shown in FIG. 4 with d=25 μm are shown in FIG. 10. The dashed curves are the results for the uncompensated structure with k=0 μm according to FIG. 9*a* and the continuous curves are the results for a compensated structure with k=50 μm according to FIG. 9*b*.

For multilayer, coil-like conducting tracks, the arrangement according to FIG. 11 offers advantages because it may be designed in a more space-saving manner compared with the compensation according to FIG. 9*b*. If what is important is only a precise inductance at low frequencies, then the approximation given above for k may be used. For precise adjustment of the resonant frequency, a compensation k of the size of the maximum layer offset v is suitable. If earth surfaces are brought close to the conducting tracks, the compensation may even be chosen to be smaller than v. In FIG. 11, because of production variability, the lower two conducting tracks are offset by a value v to the right. To compensate, on the upper layer, the neighboring conducting tracks are moved further apart by an amount k. The distributed capacitance and inductance are reduced in the conducting track pair at left in FIG. 11, but the opposite conditions apply in the conducting track pair at right, so that the resonant frequency remains constant overall. The proposed resonators are also less sensitive to variations in the width of the conducting tracks. If the conducting track width increases, the capacitance also increases, but the decreasing inductance compensates for this effect in part. The higher the ratio of the width of the conducting track to the separation from the earth surfaces, the less the resonant frequency changes.

FIGS. 12*a* and 12*b* show simple measures as to how the coupling between conducting track structures may be strengthened. The bridge 90 in FIG. 12*a* and the common conducting track member 92 in FIG. 12*b* act like an amplified magnetic coupling between the conducting track members 93 and 94 or 95 and 96, respectively. A simple adjustment of the coupling strength may be achieved by displacing the bridge without having greatly to change the remainder of the circuit. Given identical coupling, the conductors according to FIG. 12*a* or FIG. 12*b* may therefore have larger separations or be shorter. In the case of small separations, the coupling depends, according to the prior art, very strongly on the precision during production, whilst the position of a bridge may be very precisely specified. In the case of longer conducting track structures also, which may not be regarded as more than coils, the magnetic coupling is increased if, close to the foot, a bridge 90 or a common conducting track member 92 is introduced. This is particularly meaningful for broadband applications or for applications on thin substrates.

The bandpass filter illustrated in FIG. 13 is formed by two resonators 110, 112 according to FIG. 2, which are compensated according to FIG. 11 against offsets and are connected to earth 115 at their end. The conducing track member 114 amplifies the magnetic coupling between the parallel-arranged conducting tracks 113. In addition, the capacitor 118 couples the resonators. The coupling of the infeed lines 122, 124 to the resonators takes place capacitively 116 and directly, respectively. The conductor structure 120 forms an end capacitor linked to earth, which reduces the resonant frequency.

The invention claimed is:

1. A high frequency component with a substrate constructed of a plurality of dielectric layers and, between them, electrode layers having conducting track structures, the substrate including a resonator element having at least one capacitive element and at least one inductive element formed by at least one arrangement of opposed conducting track structures, the opposed conducting track structures being separated by a dielectric layer having a thickness that is smaller than the width of either of the opposed conducting track structures, the dielectric layer having a dielectric constant and thickness selected such that the common-mode impedance and the push-pull impedance between the opposed conducting track structures of the at least one arrangement differs by a factor of at least 2.

2. A high frequency component according to claim 1, characterized in that the opposed conducting track structures of the at least one arrangement are linked to each other at least at one site by a conductor or with fixed potentials.

3. A high frequency component according to claim 1, characterized in that the common-mode impedance of and the push-pull impedance between the two opposing conducting track structures of the at least one arrangement differ by a factor of at least 10.

4. The high frequency component according to claim 1, wherein the dielectric layer has a thickness of 25 μm or less.

5. A high frequency component according to claim 1, characterized in that the thickness of the dielectric layer arranged between the opposed conducting track structures of the at least one arrangement is smaller than one fifth of the width of either of the opposed conducting track structures.

6. A high frequency component according to claim 1, characterized in that the dielectric layer between the opposed conducting track structures of the at least one arrangement has an increased dielectric constant compared with surrounding dielectric layers.

7. A high frequency component according to claim 1, characterized in that the dielectric layer between the opposed conducting track structures of the at least one arrangement has a dielectric constant of greater than 5.

8. A high frequency component according to claim 1, characterized in that the dielectric layer between the opposed conducting track structures of the at least one arrangement has a dielectric constant of greater than 70.

9. A high frequency component according to claim 1, wherein the dielectric layer between the opposed conducting track structures of the at least one arrangement contains materials with barium-rare earth-titanium-perovskites, barium-strontium-titanates, bismuth pyrochlore structures, tantalum oxides, magnesium-aluminium-calcium-silicates, (calcium, strontium)-zirconates and/or magnesium titanates, also in combination with boron or lead silicate glasses.

10. A high frequency component according to claim 1, characterized in that the substrate is a ceramic laminate as a low temperature co-fired ceramics (LTCC) material or a high temperature co-fired ceramics (HTCC) material, an organic laminate, a semiconductor substrate or a substrate based on thin film technology.

11. A high frequency component according to claim 1, characterized by a working frequency above about 400 MHz.

12. A high frequency component according to claim 1, characterized in that the conducting track width of one of the opposed conducting track structures of the at least one arrangement is larger than that of the other opposed conducting track structure by a factor of 2k, where k is at least 70% of the sum of a layer offset v of the opposed conducting track structures and half the thickness d of the dielectric layer situated between the opposed conducting track structures of the at least one arrangement.

13. A high frequency component according to claim 1, characterized in that the opposed conducting track structures of the at least one arrangement each includes two sections running in the same direction, and wherein the two sections of one of the opposed conducting track structures have a separation that is larger than a separation between the two sections of the other of the opposed conducting track structures by a factor of 2k, whereby k is at least 50% of the sum of a layer offset v of the opposed conducting track structures and half the thickness d of the dielectric layer situated between the opposed conducting track structures of the at least one arrangement.

14. A high frequency component according to claim 1, characterized in that the opposed conducting tracks of the at least one arrangement are coupled by a bridge or by a common conducting member.

15. A high frequency component according to claim 14, characterized in that the bridge or the conducting member is a connection between two of the electrode layers.

16. A resonator in a high frequency component according to claim 1, characterized in that each of the opposed conducting track structures of the at least one arrangement includes a start and an end defined by a current path, wherein the start of one of the opposed conducting tracks is placed at the same potential as the end of the other of the opposed conducting tracks, the remaining end of the one of the opposed conducting tracks and the remaining start of the other of the opposed conducting tracks being unconnected.

17. A resonator in a high frequency component according to claim 16, characterized in that the start of the one opposed conducting track is connected to the end of the other opposed conducting track via a connecting conductor, the connecting conductor being a non-overlapping extension of the opposed conducting tracks and/or at least one lead-through through at least one insulating layer disposed between the opposed conducting tracks of the at least one arrangement.

18. A network with at least one resonator element according to claim 16, which performs the function of a filter, a balancing transformer and/or of an adaptor network.

19. A resonator according to claim 16, characterized in that the remaining unconnected end of the one of the opposed conducting tracks is placed at a fixed potential.

20. A resonator according to claim 16, characterized in that the remaining unconnected end of the one of the opposed conducting tracks is extended with a conducting track extension and/or connected to earth with a capacitor.

21. A resonator according to claim 16, characterized in that on at least one side of the opposed conducting track structures of the at least one arrangement, an earth surface is provided.

22. A resonator according to claim 16, characterized in that the opposed conducting track structures of the at least one arrangement are surrounded by magnetic materials.

23. A filter with at least one resonator element according to claim 16, whereby the input and output of signals and the coupling to the at least one resonator element takes place directly via a connection to the opposed conducting track structures, inductively through the conducting tracks of the at least one arrangement running parallel in places and/or capacitively via a capacitor.

24. A filter with least two resonators elements according to claim 16, whereby at least one coupling between the at least two resonators elements is generated through a common conducting track member connected to earth.

25. A balancing transformer (balun) having at least one resonator according to claim 16, whereby the input of signals takes place symmetrically and the output takes place asymmetrically.

26. An adaptor network having at least one resonator according to claim 16, whereby the impedance of couplings between the opposed conducting track structures of the at least one arrangement is determined by the positioning of the couplings.

27. A resonator in a high frequency component claim 1, characterized in that in the at least one arrangement of opposed conducting tracks, one start of one of the opposed conducting track and one end of the other of the opposed conducting tracks are connected to a fixed potential.

28. A high frequency module with at least one of the components claimed in claim 1.

29. A high frequency module according to claim 28, which performs the function of a transmitting and receiving module.

30. The high frequency component according to claim 1, wherein the resonator element has a conductor length that is less than a quarter wavelength for working frequencies above 400 MHz.

* * * * *